United States Patent
Lee et al.

(10) Patent No.: US 9,741,831 B2
(45) Date of Patent: Aug. 22, 2017

(54) FINFET AND METHOD FOR MANUFACTURING THE SAME

(71) Applicant: TAIWAN SEMICONDUCTOR MANUFACTURING CO., LTD., Hsinchu (TW)

(72) Inventors: Wei-Yang Lee, Taipei (TW); Ting-Yeh Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/016,214

(22) Filed: Feb. 4, 2016

(65) Prior Publication Data

US 2016/0163820 A1    Jun. 9, 2016

Related U.S. Application Data

(62) Division of application No. 14/561,472, filed on Dec. 5, 2014, now Pat. No. 9,287,403.

(51) Int. Cl.
*H01L 21/285* (2006.01)
*H01L 29/66* (2006.01)
*H01L 29/78* (2006.01)

(52) U.S. Cl.
CPC ...... *H01L 29/6681* (2013.01); *H01L 21/2855* (2013.01); *H01L 21/28556* (2013.01); *H01L 29/6653* (2013.01); *H01L 29/6656* (2013.01); *H01L 29/66545* (2013.01); *H01L 29/7851* (2013.01)

(58) Field of Classification Search
CPC ......... H01L 29/66553; H01L 29/66795; H01L 29/6681; H01L 29/6653; H01L 29/66545; H01L 29/6656; H01L 29/7831; H01L 29/785; H01L 27/10826; H01L 27/10879; H01L 2924/13067
See application file for complete search history.

(56) References Cited

U.S. PATENT DOCUMENTS

| | | | | |
|---|---|---|---|---|
| 8,614,127 B1 * | 12/2013 | Yang | ................. | H01L 29/66545 257/E21.429 |
| 8,697,501 B1 * | 4/2014 | Choi | ................. | H01L 29/66545 257/255 |
| 9,425,109 B2 * | 8/2016 | Cheng | .................... | H01L 22/26 |
| 9,524,965 B2 * | 12/2016 | Ho | ........................ | H01L 27/088 |
| 2008/0087942 A1 * | 4/2008 | Hsu | ........................ | H01L 27/115 257/324 |
| 2011/0101455 A1 | 5/2011 | Basker et al. | | |
| 2011/0272739 A1 | 11/2011 | Lee et al. | | |

(Continued)

*Primary Examiner* — Mohsen Ahmadi
(74) *Attorney, Agent, or Firm* — Maschoff Brennan (57) ABSTRACT

A method for manufacturing a FinFET, and FinFETs are provided. In various embodiments, the method for manufacturing a FinFET includes forming a fin structure over a substrate. Next, a dummy gate is deposited across over the fin structure. The method continues with forming a pair of first spacers on sidewalls of the dummy gate. Then, a source/drain region is formed in the fin structure not covered by the dummy gate. The method further includes removing the dummy gate to expose the fin structure. After that, the first spacers are truncated, and a gate stack is formed to cover the exposed fin structure and top surfaces of the first spacers.

15 Claims, 8 Drawing Sheets

(56) References Cited

U.S. PATENT DOCUMENTS

| | | | |
|---|---|---|---|
| 2013/0082304 A1 | 4/2013 | Liu et al. | |
| 2013/0178022 A1* | 7/2013 | Cheng | H01L 29/66795 438/157 |
| 2014/0001572 A1* | 1/2014 | Bohr | H01L 21/823821 257/401 |
| 2015/0162436 A1* | 6/2015 | Toh | H01L 29/785 257/401 |
| 2015/0255557 A1* | 9/2015 | Zhu | H01L 29/78 257/372 |

* cited by examiner

FINFET AND METHOD FOR MANUFACTURING THE SAME

RELATED APPLICATIONS

The present application is a Divisional Application of the application Ser. No. 14/561,472, filed Dec. 5, 2014.

BACKGROUND

The semiconductor industry has experienced exponential growth, and has progressed in pursuit of higher device density and performance, and lower costs. However, the classical planar transistor cannot achieve such goals due to physical constraints. Accordingly, various non-planar transistors, such as a fin-like field-effect transistor (FinFET), have been developed.

The FinFET includes a source, a drain, one or more semiconductor fin structures between the source and the drain, and a gate stack across the semiconductor fin structures. The manufacturing of the FinFET is focusing on the scaling down of dimensions of the FET to improve the packing density of the semiconductor device. With the high demands on scaling down of the FET, the method for manufacturing such FinFET has to be continuously improved so as to obtain a more satisfactory FinFET structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As aforementioned, it becomes more challenging for manufacturing a FinFET with scaled down dimensions. For instance, forming a gate of a FinFET is to form a dummy gate first, and a pair of spacers is formed on sidewalls of the dummy gate. Then, the dummy gate is removed to form a space, and gate materials are filled into the space to form the gate. As the dimensions of the FinFET scales down, the area between the spacers, which is a gate-filling window, is decreased, and thus it is difficult to perform the gap filling process to fill gate materials into the area between the spacers through the gate-filling window. Therefore, the method for manufacturing a FinFET with scaled down dimensions is continually required to be improved.

In order to solve the above-mentioned problems, the present disclosure provides a FinFET and a method for manufacturing the same, which includes enlarged gate-filling window that is beneficial for the gate-filling process. Therefore, the dimensions of the FinFET may be scaled down to improve the packing density of the semiconductor device.

Figure 1:
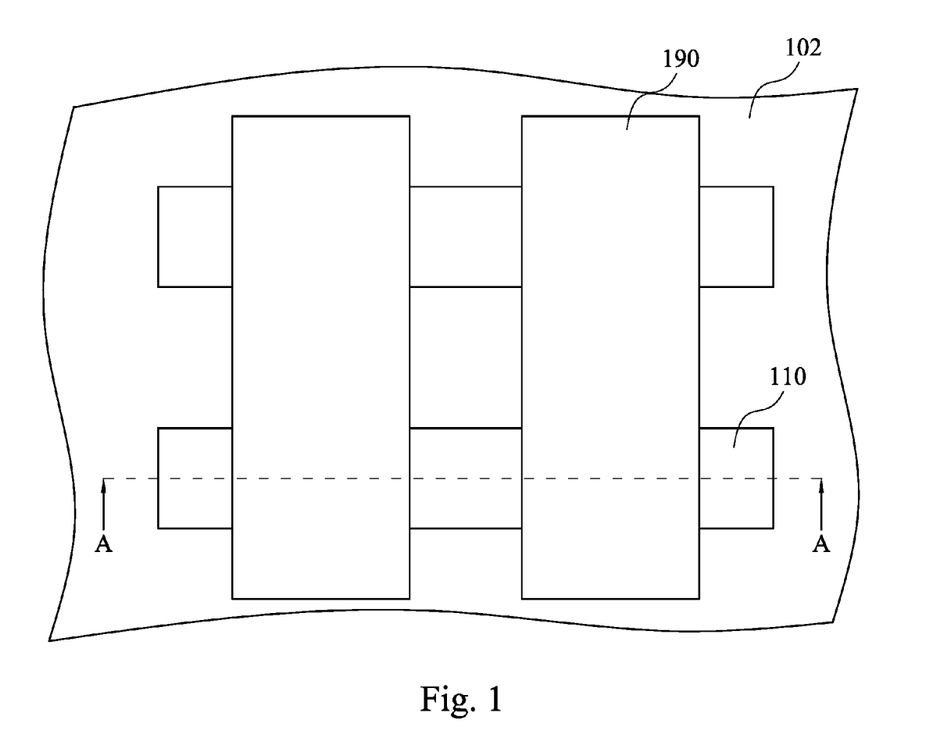
FIG. 1 is a schematic top view of a FinFET in accordance with some embodiments.

FIG. 1 is a schematic top view of a FinFET in accordance with some embodiments. FIG. 1 shows two fin structures 110 and two gate stacks 190. One should note that some of the structures have been omitted for the purpose of simplicity and clarity. The fin structures 110 are over a substrate 102, and the gate stacks 190 are across the fin structures 110. In some embodiments, the substrate 102 is a bulk substrate or a semiconductor-on-insulator (SOI) substrate. Examples of the material of the substrate 102 includes but are not limited to silicon, silicon germanium, silicon carbide, gallium arsenic, gallium phosphide, indium phosphide, indium arsenide, indium antimonide, or a combination thereof. In some embodiments, the substrate 102 and the fin structure 110 are made of the same material. In some embodiments, the substrate 102 and the fin structure 110 are integrally formed, which there is no boundary between the substrate 102 and the fin structure 110.

In some embodiments, the substrate 102 further includes isolation structures (not shown) adjacent to the fin structure 110, such as shallow trench isolation (STI) structures. The isolation structure is configured to separate the two fin structures 110. The isolation structures may be made of a dielectric material. Examples of the dielectric material includes but are not limited to silicon oxide, silicon nitride, silicon oxynitride, fluoride-doped silicate glass, a low-k dielectric material, and a combination thereof.

Figure 2A:
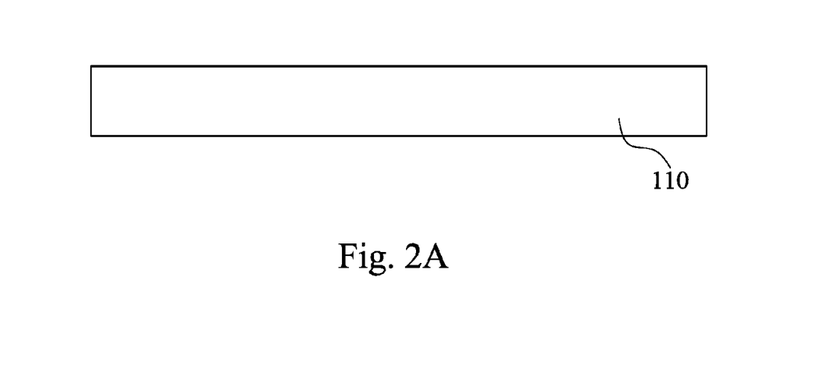
FIGS. 2A through 2N are cross-sectional views at various stages of manufacturing the FinFET along line A-A in FIG. 1.
Figure 2B:
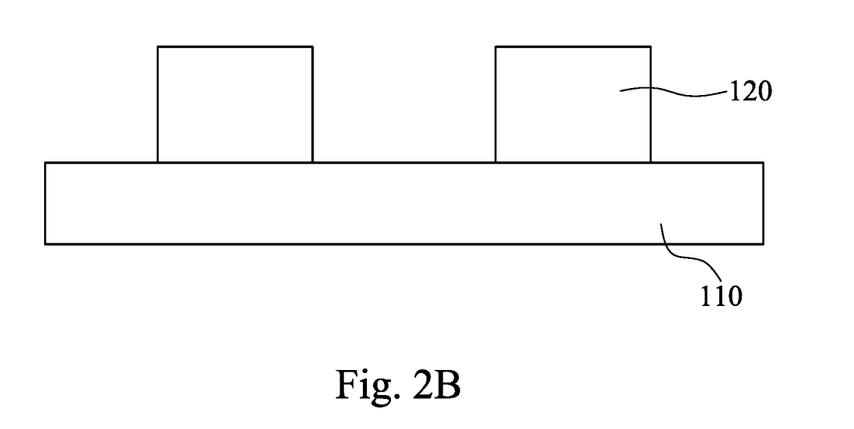
Figure 2C:
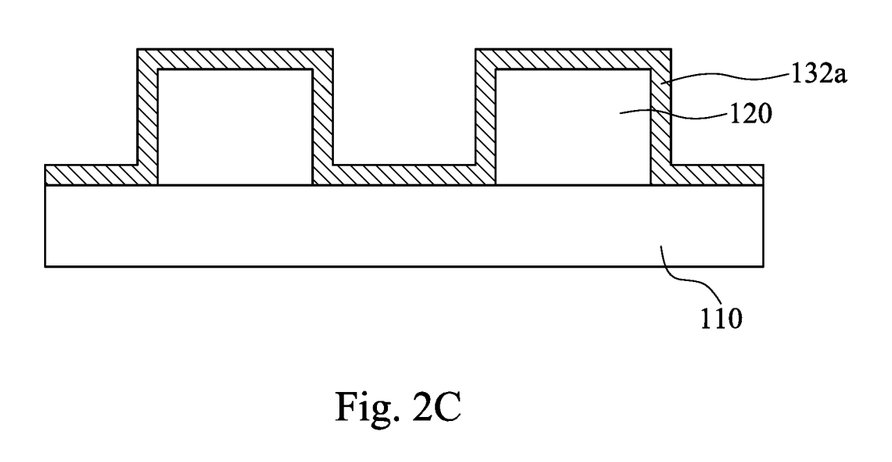
Figure 2D:
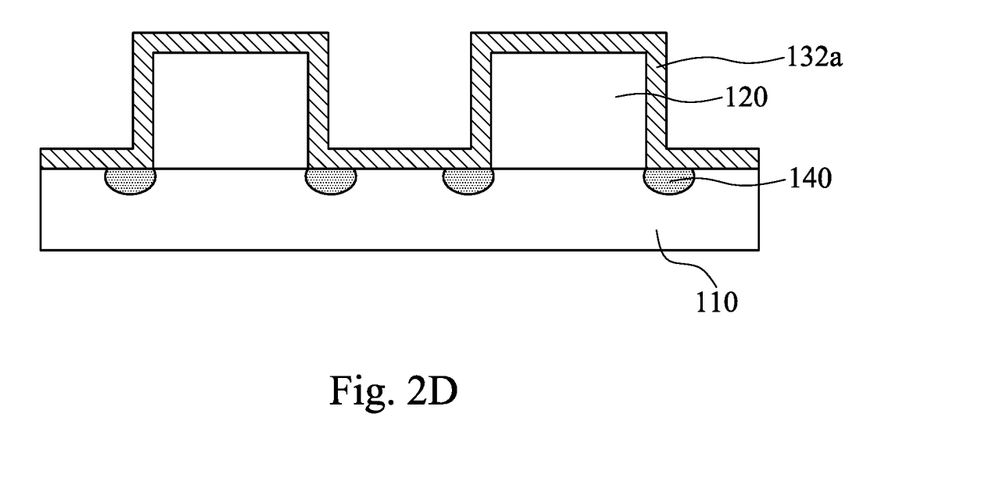
Figure 2E:
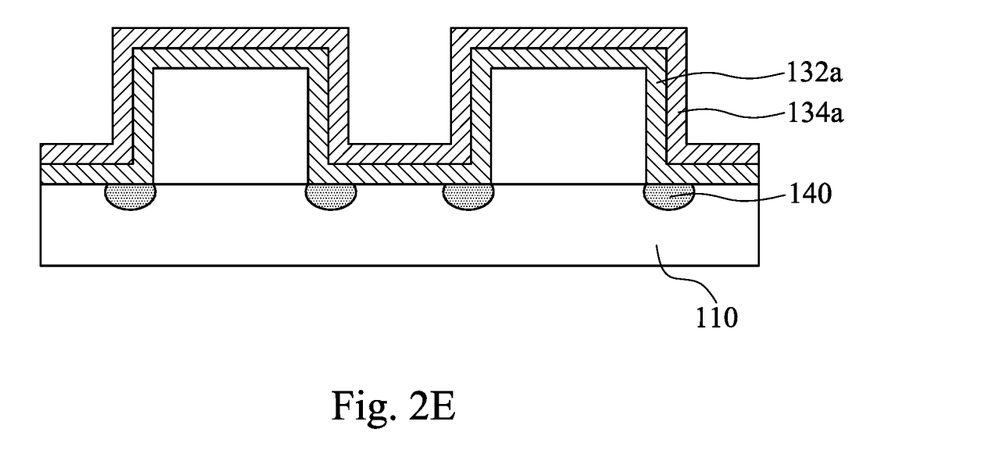
Figure 2F:
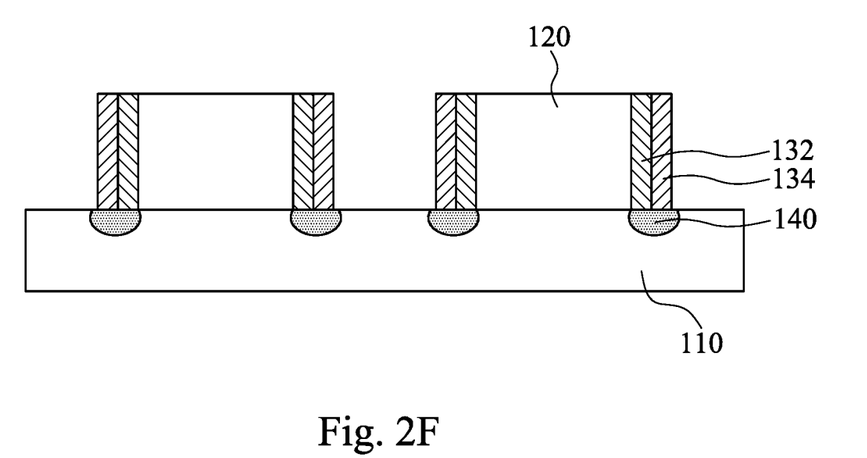
Figure 2G:
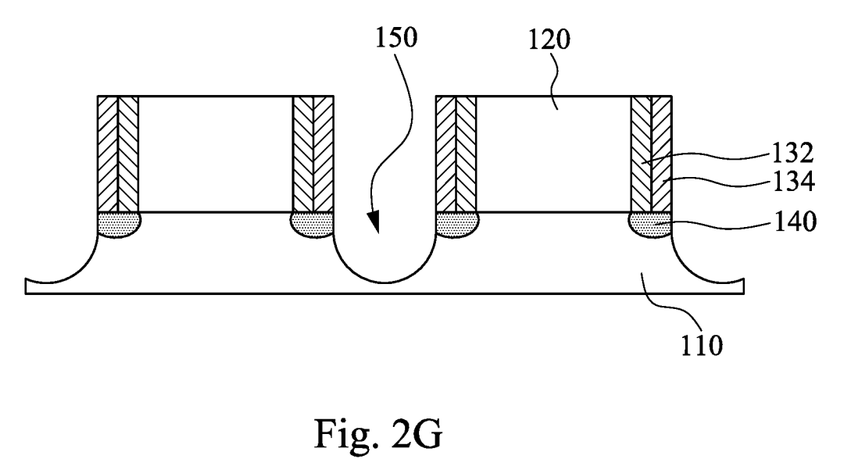
Figure 2H:
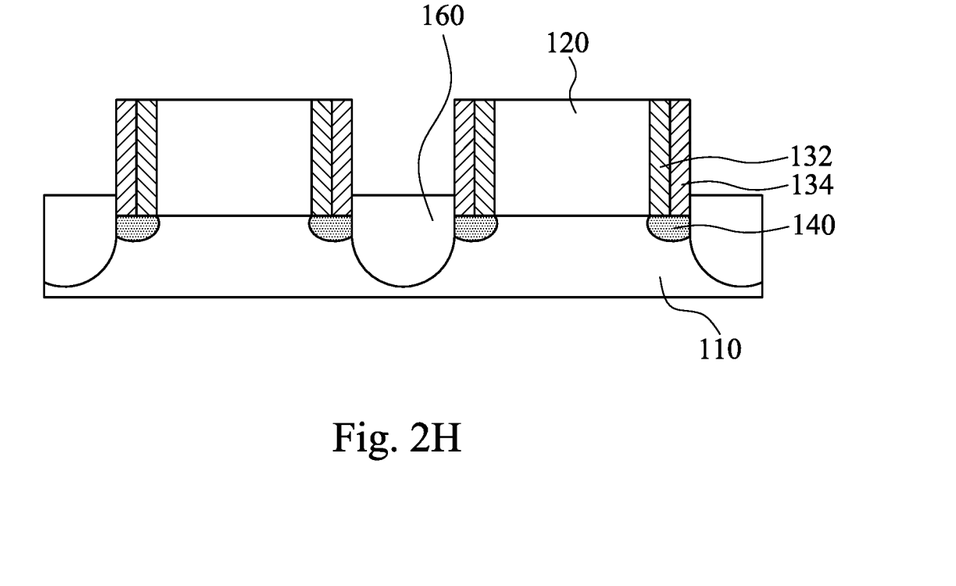
Figure 2I:
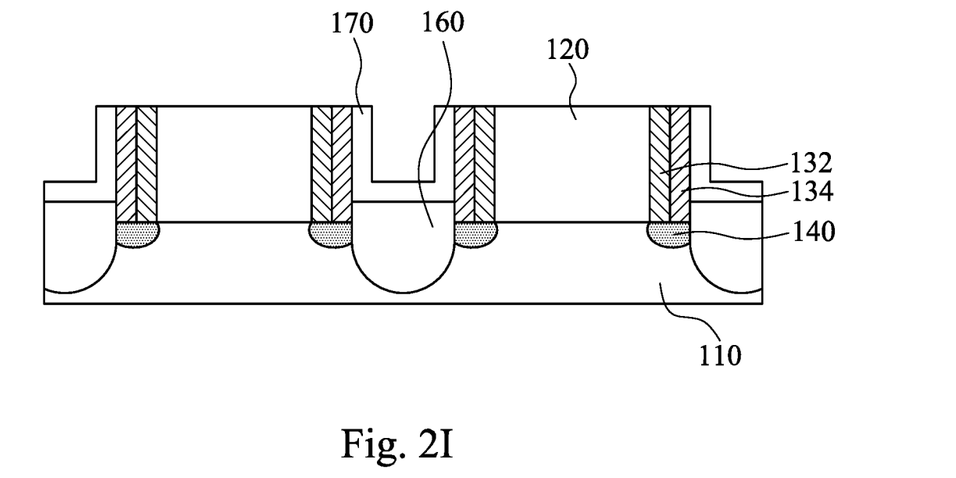
Figure 2J:
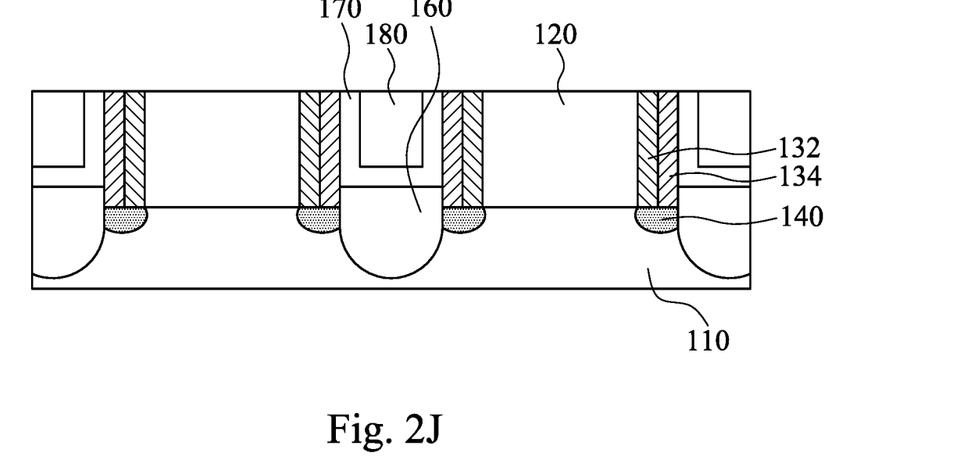
Figure 2K:
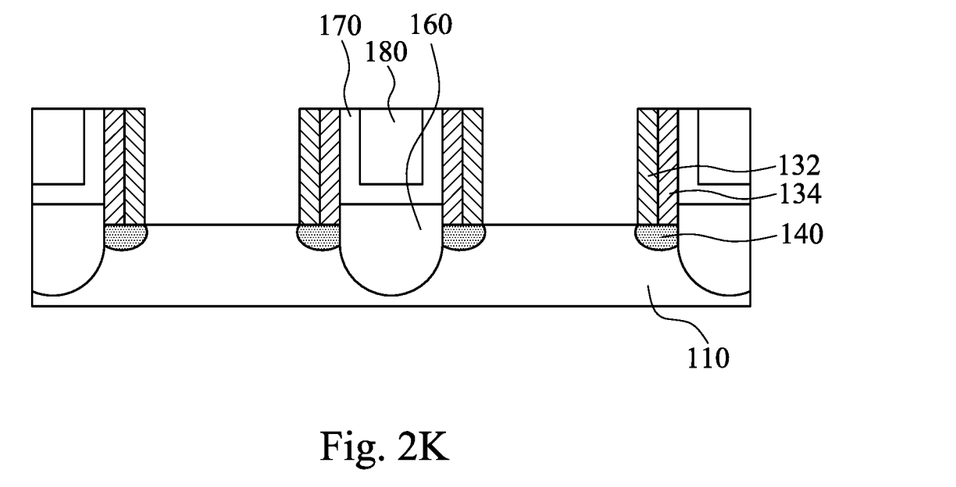
Figure 2L:
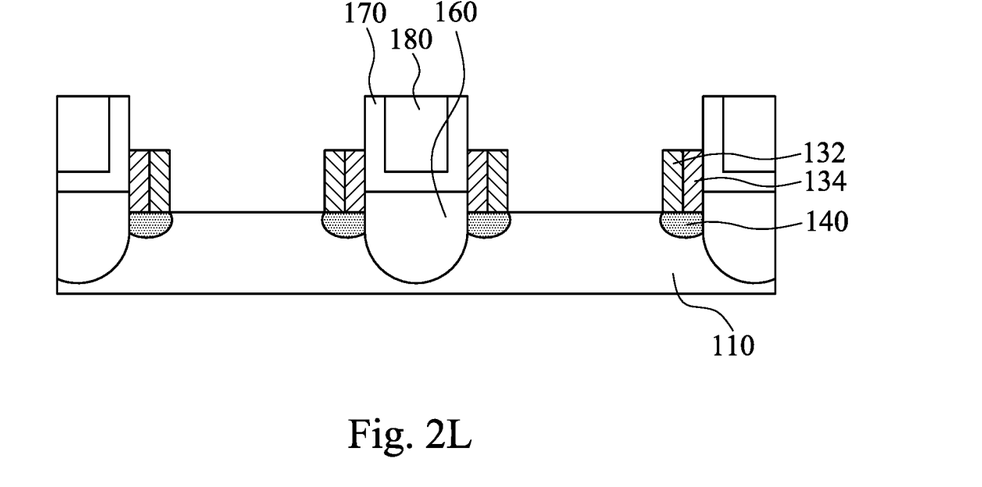
Figure 2M:
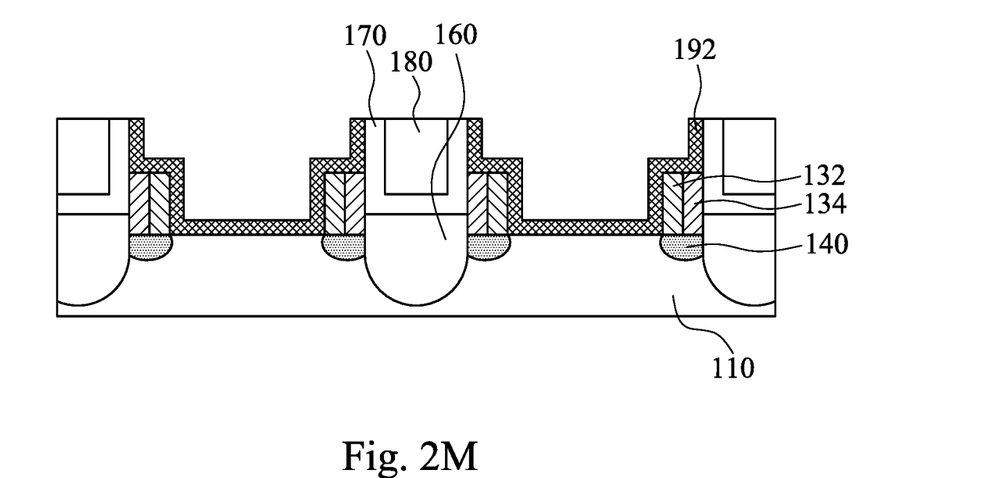
Figure 2N:
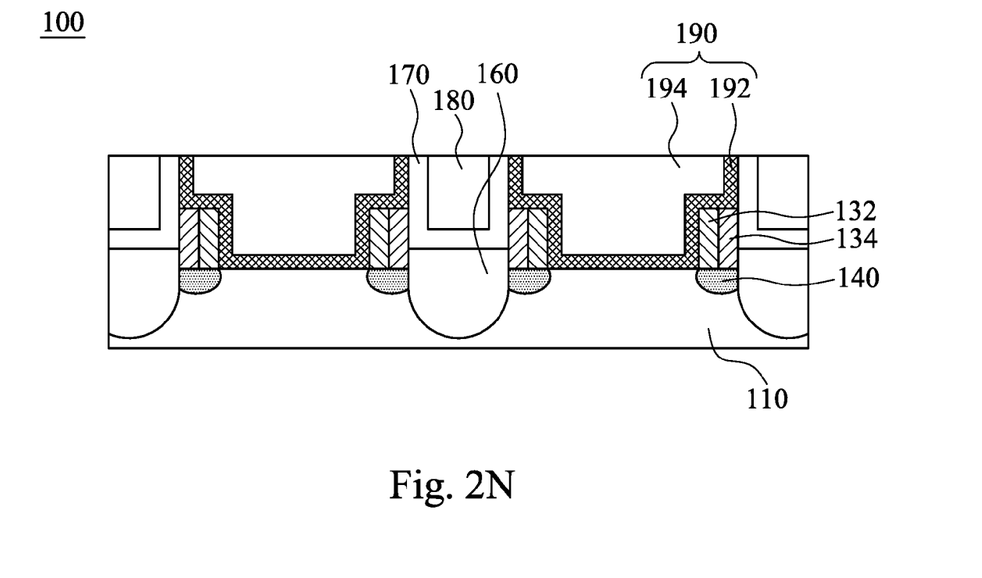

FIGS. 2A through 2N are cross-sectional views at various stages of manufacturing a FinFET 100 along line A-A in FIG. 1, which are cross-sectional views taken along an axis of the fin structure 110. The substrate 102 in FIG. 1 is omitted in FIGS. 2A through 2N.

Referring to FIG. 2A, the fin structure 110 is formed over the substrate (not shown in FIG. 2A). The fin structure 110 may be formed by any suitable processes, such as photolithography and etching. The photolithography may include forming a photoresist layer (not shown) over the substrate, exposing the photoresist layer to form a pattern, performing post-exposure bake processes, and developing the pattern to form a photoresist mask. The aforementioned photoresist mask is used to protect portions of the substrate while forming trenches in the substrate by the etching process, to form the fin structures 110.

Referring to FIG. 2B, dummy gates 120 are formed across over the fin structures 110. The dummy gates 120 may be formed by any suitable processes, such as a process includes deposition, photolithography patterning, and etching. Examples of the deposition include but are not limited to chemical vapor deposition (CVD), physical vapor deposition (PVD), atomic layer deposition (ALD), and a combination thereof. Examples of the photolithography patterning include but are not limited to photoresist coating (e.g., spin-on coating), soft baking, mask aligning, exposure, post-exposure baking, developing the photoresist, rinsing, drying (e.g., hard baking), and a combination thereof. The etching may be dry etching or wet etching. Examples of the material of the dummy gate 120 include but are not limited to polycrystalline-silicon (poly-Si), poly-crystalline silicon germanium (poly-SiGe), and silicon nitride.

Then, the method for manufacturing the FinFET 100 continues with forming pairs of first spacers, doped regions, and pairs of second spacers. FIGS. 2C through 2F show a process for forming the first spacers, the doped regions, and the second spacers in accordance with some embodiments.

Referring to FIG. 2C, a layer of first spacers material 132a is deposited over the fin structures 110 and the dummy gates 120.

Referring to FIG. 2D, doped regions 140 are formed in the fin structure 110 and are adjacent to the dummy gates 120. In some embodiments, the doped regions 140 are lightly drain doped (LDD) regions, and are formed by implantation. In some embodiments, the doped regions 140 have a dopant concentration in a range of about $10^{15}$ ions/cm$^3$ to about $10^{17}$ ions/cm$^3$. For the n-type FinFET, the doped regions 140 may include n-type dopants, such as phosphorus, arsenic, antimony, bismuth, selenium, tellurium, and a combination thereof. For the p-type FinFET, the doped regions 140 may include p-type dopants, such as boron, boron difluoride, and a combination thereof.

Referring to FIG. 2E, a layer of second spacers material 134a is deposited over the layer of first spacers material 132a.

Referring to FIG. 2F, the layer of first spacers material 132a and the layer of second spacers material 134a are etched to expose the fin structure 110 and top surfaces of the dummy gate 120. Accordingly, pairs of first spacers 132 are formed on opposite sidewalls of the dummy gates 120, and pairs of second spacers 134 are formed adjacent to the first spacers 132.

Next, the method for manufacturing the FinFET 100 continues with forming source/drain regions in the fin structure not covered by the dummy gates. The source/drain regions may be formed by any suitable processes. FIGS. 2G and 2H show a process for forming the source/drain region in accordance with some embodiments.

Referring to FIG. 2G, portions of the fin structure 110 that are not covered by the dummy gates 120 are removed to form recesses 150. Referring to FIG. 2H, source/drain regions 160 are then formed in the recesses 150. In some embodiments, the source/drain regions 160 are formed by epitaxy, and the source/drain regions 160 are epitaxial source/drain regions. In some embodiments, the source/drain regions 160 are epitaxially grown in the recesses 150. In some embodiments, the source/drain regions 160 are epitaxially grown protruding from the recesses 150, and thus the source/drain regions 160 have top surfaces higher than a top surface of the fin structure 110.

It is noteworthy that the method for manufacturing the FinFET 100 includes forming two pairs of spacers (the first spacers 132 and the second spacers 134) on the sidewalls of each dummy gate 120, which increases the distance between source/drain regions and each gate stack in the following manufacturing steps. By forming two pairs of spacers, it can prevent the source/drain regions from being too close to the gate stack, and the liability of the FinFET is thus increased.

Referring to FIG. 2I, contact etch stop layers (CESL) 170 are formed over the source/drain regions 160. In some embodiments, the CESL 170 is formed by deposition of a CESL material, and then etching of the CESL material to form the CESL 170. The CESL material may be silicon nitride, such as $Si_3N_4$, silicon oxy-nitride, silicon carbon nitride, or a combination thereof.

Referring to FIG. 2J, interlayer dielectric (ILD) layers 180 are formed over the CESL 170. The ILD layers 180 may be formed by any suitable processes, such as deposition. In some embodiments, the ILD layers 180 are formed by a plasma enhanced chemical vapor deposition (PECVD) process, a low-pressure chemical vapor deposition (LPCVD) process, an atmospheric pressure chemical vapor deposition (APCVD) process, spin-on, or sputtering. The material of the ILD layers 180 may be any suitable material. In some embodiments, the material of the ILD layers 180 is silicone oxide, silicon nitride, silicon oxy-nitride, silicon carbide, or a combination thereof. A polishing process may be performed after the deposition of the ILD layer 180 to planarize upper surfaces. In some embodiments, the polishing process includes a chemical-mechanical-polishing (CMP) process.

Referring to FIG. 2K, the dummy gates 120 are removed to expose the fin structure 110 for the subsequent process of forming gate stacks.

Referring to FIG. 2L, the first spacers 132 and the second spacers 134 are truncated. In other words, upper portions of the first spacers 132 and the second spacers 134 are removed. The first spacers 132 and the second spacers 134 may be truncated by any suitable processes. In some embodiments, the first spacers 132 and the second spacers 134 are truncated by etching, such as oxygen ($O_2$) ashing, oxygen and carbon tetrachloride ($O_2+CF_4$) ashing, or carbon monoxide (CO) ashing.

The upper portions of both first spacers 132 and second spacers 134 in the FinFET 100 are removed simultaneously during the etching. Therefore, the first spacers 132 and the second spacers 134 may be made from the same type of material to be etched at one step. In some embodiments, the first spacers 132 and the second spacers 134 are made of a material independently selected from the group consisting of silicon nitride (SiN) and SiCN (silicon carbonitride). The first spacers 132 and the second spacers 134 may be made from different types of material and be etched at different steps by using different truncating processes.

The method for manufacturing the FinFET 100 may include cleaning wafer, where the substrate and the FinFET 100 are manufactured thereon, after etching the first spacers 132 and the second spacers 134 to remove residues produced by the etching process. In some embodiments, cleaning the wafer may be performed by a RCA cleaning process.

In general FinFET, a gate-filling window is the area between a pair of spacers that is formed after the removal of a dummy gate. In the FinFET 100 in accordance with some embodiments, as shown in FIG. 2L, a gate-filling window is the area between each two CESL 170 that is formed after removing the dummy gate 120 and truncating the first spacers 132 and the second spacers 134. Because the upper portions of the first spacers 132 and the second spacers 134 are removed, each of the gate-filling windows of the FinFET 100 is enlarged. In some embodiments, each first spacer 132 and the adjacent second spacer 134 have a combined thickness in a range from about 3 nm to about 10 nm. Therefore, each gate-filling window of the FinFET 100 may be enlarged by twice as the combined thickness of the first spacer 132 and the second spacer 134, which is about 6 nm to about 20 nm.

Then, the method for manufacturing the FinFET 100 continues with forming a gate stack. The gate stack may be formed by any suitable processes, and may include depositions to form various gate materials, a CMP process to remove the excessive gate materials, and planarize the top surface of the FinFET 100. FIGS. 2M and 2N show a process for forming the gate stack in accordance with some embodiments. In embodiments shown in FIGS. 2M and 2N, a gate stack 190 includes a gate dielectric layer 192 and a gate electrode 194.

Referring to FIG. 2M, the gate dielectric layers 192 are formed to cover the exposed fin structure 110 and the top surfaces of the first spacers 132 and the top surfaces of the second spacers 134. In some embodiments, the gate dielectric layers 192 are high-k dielectric layers. As used herein, the term "high-k dielectric" refers to the material having a dielectric constant, k, greater than about 3.9, which is the k value of SiO2. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3, and each value of y is independently from 0 to 2.

Referring to FIG. 2N, the gate electrodes 194 are formed over the gate dielectric layers 192. In some embodiments, the gate electrodes 194 are made of a material such as metal, metal alloy, and metal silicide. Examples of the material of the metal gate electrode include but are not limited to tungsten (W), titanium (Ti), tantalum (Ta), aluminum (Al), nickel (Ni), ruthenium (Ru), palladium (Pd), platinum (Pt), tungsten nitride ($WN_x$), titanium nitride (TiN), tantalum nitride (TaN), aluminum nitride (AlN), tungsten silicide ($WSi_x$), nickel silicide ($Ni_2Si$), titanium silicide ($TiSi_2$), titanium aluminide (TiAl), an alloy thereof, and a combination thereof.

In some embodiments, the gate dielectric layer 192 and the gate electrode 194 are formed by deposition, such as chemical vapor deposition (CVD), atmospheric pressure CVD (APCVD), low pressure CVD (LPCVD), plasma enhanced CVD (PECVD), metal-organic CVD (MOCVD), physical vapor deposition (PVD), atomic layer deposition (ALD), chemical solution deposition, sputtering, and a combination thereof.

As shown in FIG. 2N, the gate stacks 190 cover the top surfaces of the first spacers 132 and the second spacers 134. In other words, each first spacer 132 and the adjacent second spacer 134 render the sidewall of the gate stack 190, which the first spacer 132 is deposited on, as a stepped shape. The top surface of each gate stack 190 has a width larger than that of the bottom surface of each gate stack 190 because of the enlarged gate-filling window caused by the truncated first spacers 132 and second spacers 134.

Although there are two pairs of spacers 132 and 134 on sidewalls of each gate stack 190 in the FinFET 100, a FinFET may include only one pair of spacers on opposite sidewalls of each gate stack while still having the advantages described above as long as the pair of spacers is truncated. The stepped shape of the sidewalls of the gate stack may be adjusted by the thickness of the spacer.

The FinFET 100 shown in FIG. 2N, which is manufactured by the method shown in FIGS. 2A through 2N in accordance with some embodiments, includes a fin structure 110, gate stack 190, pairs of first spacers 132, pairs of second spacers 134, source/drain regions 160, doped regions 140, contact etch stop layers (CESLs) 170, and interlayer dielectric (ILD) layers 180. The fin structure 110 is over a substrate (not shown). Each of the gate stacks 190 includes a dielectric layer 192 and a gate electrode 194, and is across the fin structure 110. Each pair of the first spacers 132 is on sidewalls of the gate stack 190, and the second spacers 134 are adjacent to the first spacer 132. The source/drain regions 160 are in the fin structure 110 at portions that are not covered by the gate stacks 190, and each two of the source/drain regions 160 are separated by one gate stack 190. The gate stacks 190 cover top surfaces of the first spacers 132 and the second spacers 134.

In some embodiments, the gate stack 190 has a height in a range from about 30 nm to about 50 nm.

The first spacers 132 have top surfaces at the same height as top surfaces of the second spacers 134. In some embodiments, the first spacers 132 and the second spacers 134 have a height in a range from about 20 nm to about 30 nm. The first spacers 132 and the second spacers 134 have to have a height above about 20 nm to prevent the gate stacks 190 from touching the source/drain regions 160, otherwise short circuits might occur.

Figure 3:
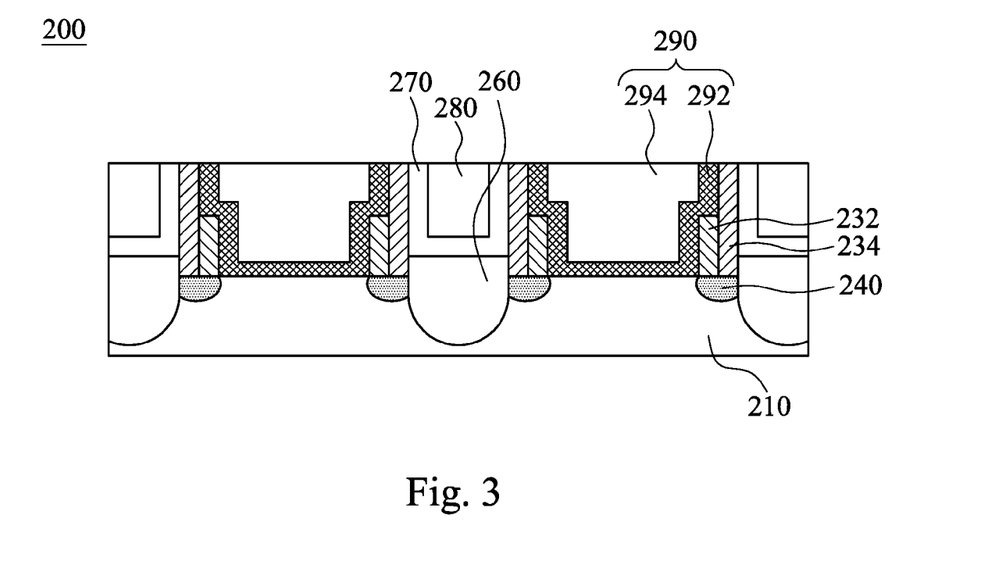
FIG. 3 is a cross-sectional view of a FinFET in accordance with other embodiments.

FIG. 3 is a cross-sectional view of a FinFET 200 in accordance with other embodiments. The FinFET 200 includes a fin structure 210, gate stack 290, pairs of first spacers 232, pairs of second spacers 234, source/drain regions 260, doped regions 240, contact etch stop layers (CESLs) 270, and interlayer dielectric (ILD) layers 280. The fin structure 210 is over a substrate (not shown). Each of the gate stacks 290 includes a dielectric layer 292 and a gate electrode 294, and is across the fin structure 210. Each pair of the first spacers 232 is on sidewalls of the gate stack 290, and the second spacers 234 are adjacent to the first spacer 232. The source/drain regions 260 are in the fin structure 210 at portions that are not covered by the gate stacks 290, and each two of the source/drain regions 260 are separated by one gate stack 290. The gate stacks 290 cover top surfaces of the first spacers 232, and not cover top surfaces of the second spacers 234.

In some embodiments, the material of the fin structure 210 is the same as the substrate, such as silicon, silicon germanium, silicon carbide, gallium arsenic, gallium phosphide, indium phosphide, indium arsenide, indium antimonide, or a combination thereof.

Each first spacer 232 and the adjacent second spacer 234 render the sidewall of the gate stack 290, which the first spacer 232 is deposited on, as a stepped shape. The top surface of each gate stack 290 has a width larger than that of the bottom surface of each gate stack 290 because of the enlarged gate-filling window caused by the truncated first spacers 232. In some embodiments, the gate-filling window for manufacturing the FinFET 200 is enlarged by about 3 nm to about 10 nm, which is the sum of the thickness of one pair of the first spacers 232. In some embodiments, the gate stack 290 has a height in a range from about 30 nm to about 50 nm.

The dielectric layers 292 may be high-k dielectric layers. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, SiN$_x$, a silicate thereof, and an alloy thereof. Each value of x is independently from 0.5 to 3, and each value of y is independently from 0 to 2. The gate electrodes 294 may be made of a material such as metal, metal alloy, and metal silicide. Examples of the material of the metal gate electrode include but are not limited to tungsten (W), titanium (Ti), tantalum (Ta), aluminum (Al), nickel (Ni), ruthenium (Ru), palladium (Pd), platinum (Pt), tungsten nitride (WN$_x$), titanium nitride (TiN), tantalum nitride (TaN), aluminum nitride (AlN), tungsten silicide (WSi$_x$), nickel silicide (Ni$_2$Si), titanium silicide (TiSi$_2$), titanium aluminide (TiAl), an alloy thereof, and a combination thereof.

The difference between the FinFET 100 shown in FIG. 2N and the FinFET 200 shown in FIG. 3 is that the gate stacks 290 of the FinFET 200 only cover top surfaces of the first spacers 232, and the second spacers 234 of the FinFET 200 have top surfaces higher than the top surfaces of the first spacers 232. In some embodiments, the first spacers 132 have a height in a range from about 20 nm to about 30 nm, and the second spacers 134 have a height as the gate stack 290, which is in a range from about 30 nm to about 50 nm. The first spacers 132 have to have a height above about 20 nm to prevent the gate stacks 290 from touching the source/drain regions 260, otherwise short circuits might occur.

The FinFET 200 may be fabricated using a method similar to that described above with reference to FIGS. 2A-2N, but only the first spacers 232 are truncated, i.e. only upper portions of the first spacers 232 are removed. The second spacers 234 are not truncated, which may be determined by the materials of the first spacers 232 and the second spacers 234. For instance, the first spacers 232 and the second spacers 234 are made of different types of materials in order to remove upper portions of the first spacers 232 only during the truncation. In some embodiments, the first spacers 232 are made of a material selected from the group consisting of low-k SiOC and SiOCN, and the second spacers 234 are made of a material selected from the group consisting of SiN and SiCN. It is noteworthy that because the capacitance (C) is proportional to k, and reducing capacitance is critical for improving AC performance. Therefore, using low-k material to make the first spacers 232 leads to the decreased in C, and the AC performance for the FinFET 200 is thereby improved.

Although only the first spacers 232 are truncated in the FinFET 200, the gate-filling window may still be enlarged, which is benefit for the gate-filling process during manufacturing the FinFET 200. Therefore, the dimensions of the FinFET may be scaled down, and thereby increases packing density.

The embodiments of the present disclosure discussed above have advantages over exiting methods and systems. The FinFET, which includes the truncated first spacers or the truncated first spacers and second spacers, has enlarged gate-filling windows, which is benefit for manufacturing a FinFET with scaled down dimensions during the gate-filling process. Therefore, more FinFETs can be configured to a single wafer, and the packing density can be increased. It is understood, however, that other embodiments may have different advantages, and that no particular advantages is required for all embodiments.

In accordance with some embodiments of the present disclosure, a method for manufacturing a FinFET includes forming a fin structure over a substrate. Next, a dummy gate is deposited across over the fin structure. The method continues with forming a pair of first spacers on sidewalls of the dummy gate. Then, a source/drain region is formed in the fin structure not covered by the dummy gate. The method further includes removing the dummy gate to expose the fin structure. After that, the first spacers are truncated, and a gate stack is formed to cover the exposed fin structure and top surfaces of the first spacers.

In accordance with other embodiments of the present disclosure, a FinFET includes a fin structure, a gate stack, a pair of first spacers, and a source/drain region. The fin structure is over a substrate, and the gate stack is across the fin structure. The first spacers are on sidewalls of the gate stack. The source/drain region is in the fin structure that is not covered by the gate stack. The gate stack covers top surfaces of the first spacers.

In accordance with yet other embodiments of the present disclosure, a FinFET includes a fin structure, a gate stack, a pair of first spacers, a pair of second spacers, and a source/drain region. The fin structure is over a substrate, and the gate stack is across the fin structure. The first spacers are on sidewalls of the gate stack, and the second spacers are adjacent to the first spacers. The source/drain region is in the fin structure that is not covered by the gate stack. The gate stack covers top surfaces of the first spacers or covers top surfaces of the first spacers and the second spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a FinFET, the method comprising:
    forming a fin structure over a substrate;
    depositing a dummy gate across over the fin structure;
    forming a pair of first spacers on sidewalls of the dummy gate;
    forming a pair of second spacers adjacent to the first spacers;
    forming a source/drain region in the fin structure not covered by the dummy gate;
    removing the dummy gate to expose the fin structure;
    truncating the first spacers;
    forming a contact etch stop layer over the source/drain region;
    forming an interlayer dielectric layer over the contact etch stop layer; and
    forming a gate stack covering the exposed fin structure and top surfaces of the first spacers.

2. The method of claim 1, further comprising forming doped regions in the fin structure and adjacent to the dummy gate.

3. The method of claim 1, wherein truncating the first spacers is performed by etching the first spacers to remove upper portions of the first spacers.

4. The method of claim 3, wherein etching the first spacers is performed by oxygen ashing, oxygen and carbon tetrachloride ashing, or carbon monoxide ashing.

5. The method of claim 1, further comprising:
    truncating the second spacers; and
    forming the gate stack covering top surfaces of the second spacers.

6. The method of claim 5, wherein truncating the second spacers is performed by etching the second spacers to remove upper portions of the second spacers, and etching the second spacers is performed by oxygen ashing, oxygen and carbon tetrachloride ($CF_4$), or carbon monoxide ashing.

7. The method of claim 1, wherein the first spacers are made of a material selected from the group consisting of low-k SiOC and SiOCN.

8. The method of claim 1, wherein the contact etch stop layer comprises a material selected from a group consisting of silicon nitride, such as $Si_3N_4$, silicon oxy-nitride, silicon carbon nitride, and a combination thereof.

9. The method of claim 1, wherein the first spacers are made of a material selected from the group consisting of low-k SiOC and SiOCN, and the second spacers are made of a material selected from the group consisting of SiN and SiCN.

10. A method for manufacturing a FinFET, the method comprising:
    forming a dummy gate across over a fin structure;
    forming a pair of first spacers on sidewalls of the dummy gate;
    forming a pair of second spacers on sidewalls of the first spacers;
    forming a recess in the fin structure and not covered by the dummy gate;
    epitaxially growing a source/drain region in the recess;
    removing the dummy gate to expose the fin structure;
    removing upper portions of the first spacers;
    forming a contact etch stop layer over the source/drain region;
    forming a dielectric layer on the contact etch stop layer; and
    forming a gate stack covering the exposed fin structure and top surfaces of the first spacers.

11. The method of claim 10, further comprising removing upper portions of the second spacers.

12. The method of claim 10, further comprising forming doped regions in the fin structure and adjacent to the dummy gate.

13. The method of claim 10, wherein forming the gate stack comprises:
    forming a gate dielectric layer covering the exposed fin structure and top surfaces of the first spacers; and
    forming a gate electrode on the gate dielectric layer.

14. The method of claim 13, wherein the gate electrode comprises a material selected from a group consisting of tungsten (W), titanium (Ti), tantalum (Ta), aluminum (Al), nickel (Ni), ruthenium (Ru), palladium (Pd), platinum (Pt), tungsten nitride (WNx), titanium nitride (TiN), tantalum nitride (TaN), aluminum nitride (AlN), tungsten silicide (WSix), nickel silicide ($Ni_2Si$), titanium silicide ($TiSi_2$), titanium aluminide (TiAl), an alloy thereof, and a combination thereof.

15. The method of claim 13, wherein the gate dielectric layer comprises a material selected from a group consisting of $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate, and a combination thereof.

* * * * *